US010526501B2

(12) United States Patent
Dietsch et al.

(10) Patent No.: US 10,526,501 B2
(45) Date of Patent: Jan. 7, 2020

(54) COMPOSITION COMPRISING SILVER NANOWIRES IN AN ALCOHOL/WATER MIXTURE AND DISPERSED STYRENE/(METH)ACRYLIC COPOLYMERS FOR THE PREPARATION OF ELECTROCONDUCTIVE TRANSPARENT LAYERS

(71) Applicant: BASF SE, Ludwigshafen (DE)

(72) Inventors: Herve Dietsch, Bad Duerkheim (DE); Thomas Sturm, Schifferstadt (DE); Danny Seyfried, Ludwigshafen (DE); Rui Zhang, West New York, NJ (US)

(73) Assignee: BASF SE, Ludwigshafen (DE)

( * ) Notice: Subject to any disclaimer, the term of this patent is extended or adjusted under 35 U.S.C. 154(b) by 4 days.

(21) Appl. No.: 15/564,779

(22) PCT Filed: Mar. 21, 2016

(86) PCT No.: PCT/EP2016/056109
§ 371 (c)(1),
(2) Date: Oct. 6, 2017

(87) PCT Pub. No.: WO2016/162192
PCT Pub. Date: Oct. 13, 2016

(65) Prior Publication Data
US 2018/0105713 A1   Apr. 19, 2018

Related U.S. Application Data

(60) Provisional application No. 62/144,961, filed on Apr. 9, 2015.

(51) Int. Cl.
C09D 11/52 (2014.01)
C09D 11/033 (2014.01)
C09D 11/037 (2014.01)
C09D 11/106 (2014.01)
C09D 11/107 (2014.01)
C09D 11/108 (2014.01)
C09D 7/00 (2018.01)
C08K 3/04 (2006.01)
H05K 1/09 (2006.01)
H05K 3/12 (2006.01)
H01B 1/02 (2006.01)
H01B 1/22 (2006.01)
B05D 1/00 (2006.01)
B05D 1/28 (2006.01)
B05D 1/32 (2006.01)
B05D 1/40 (2006.01)
C09D 7/40 (2018.01)
H05K 1/03 (2006.01)
C08K 7/24 (2006.01)
C08K 3/08 (2006.01)

(52) U.S. Cl.
CPC .............. *C09D 11/52* (2013.01); *B05D 1/005* (2013.01); *B05D 1/28* (2013.01); *B05D 1/32* (2013.01); *B05D 1/40* (2013.01); *C09D 7/70* (2018.01); *C09D 11/037* (2013.01); *C09D 11/107* (2013.01); *C09D 11/108* (2013.01); *H01B 1/026* (2013.01); *H05K 1/0353* (2013.01); *H05K 1/097* (2013.01); *H05K 3/1216* (2013.01); *C08K 7/24* (2013.01); *C08K 2003/0806* (2013.01); *C08K 2201/001* (2013.01); *C08K 2201/003* (2013.01); *C08K 2201/004* (2013.01); *C08K 2201/011* (2013.01); *H05K 2201/026* (2013.01); *H05K 2203/0736* (2013.01)

(58) Field of Classification Search
None
See application file for complete search history.

(56) References Cited

U.S. PATENT DOCUMENTS

| 4,414,370 | A | 11/1983 | Hamielec et al. |
| 4,529,787 | A | 7/1985 | Schmidt et al. |
| 4,546,160 | A | 10/1985 | Brand et al. |
| 5,508,366 | A | 4/1996 | Andrist et al. |
| 8,049,333 | B2 | 11/2011 | Alden et al. |
| 10,201,082 | B2 * | 2/2019 | Zhang ................. G02F 1/13439 |
| 2008/0182090 | A1 * | 7/2008 | Rouse .................... C09D 11/52 428/208 |
| 2009/0035707 | A1 * | 2/2009 | Wang ....................... C09D 5/24 430/322 |
| 2010/0151120 | A1 * | 6/2010 | Bai ......................... B82Y 10/00 427/98.5 |
| 2011/0097277 | A1 * | 4/2011 | Jiang ....................... C08J 3/075 424/9.322 |
| 2011/0155812 | A1 | 6/2011 | Rouse et al. |

(Continued)

FOREIGN PATENT DOCUMENTS

EP   2 594 613 A2   5/2013
KR   20010084640 A  * 9/2001

(Continued)

OTHER PUBLICATIONS

International Search Report dated May 19, 2016 in PCT/EP2016/056109 filed Mar. 21, 2016.

*Primary Examiner* — Helene Klemanski
(74) *Attorney, Agent, or Firm* — Oblon, McClelland, Maier & Neustadt, L.L.P.

(57) ABSTRACT

Described is a composition suitable for the preparation of an electroconductive transparent layer, said composition comprising a mixture of water and one or more alcohols, electroconductive nanoobjects and one or more dissolved styrene/(meth)acrylic copolymers.

12 Claims, No Drawings

(56) References Cited

U.S. PATENT DOCUMENTS

| | | | |
|---|---|---|---|
| 2012/0097059 A1 | 4/2012 | Allemand et al. | |
| 2013/0207294 A1 | 8/2013 | Jeon et al. | |
| 2013/0251983 A1* | 9/2013 | Kondo | H01B 1/22 428/336 |
| 2013/0342221 A1* | 12/2013 | Virkar | G06F 3/041 324/661 |
| 2014/0004371 A1* | 1/2014 | Chung | H01B 1/02 428/549 |
| 2014/0255707 A1* | 9/2014 | Philip, Jr. | C09D 7/70 428/457 |
| 2015/0014025 A1* | 1/2015 | Poon | H05K 1/0274 174/253 |
| 2015/0170785 A1* | 6/2015 | Watt | C09D 11/52 428/457 |
| 2016/0040023 A1* | 2/2016 | Ishii | C09D 11/52 349/12 |
| 2017/0233588 A1* | 8/2017 | Dietsch | C09D 5/24 428/336 |
| 2017/0292026 A1* | 10/2017 | Zhang | C09D 5/24 |

FOREIGN PATENT DOCUMENTS

| | | |
|---|---|---|
| WO | WO 01/64764 A1 * | 9/2001 |
| WO | 2016/023887 A1 | 2/2016 |

\* cited by examiner

COMPOSITION COMPRISING SILVER NANOWIRES IN AN ALCOHOL/WATER MIXTURE AND DISPERSED STYRENE/(METH)ACRYLIC COPOLYMERS FOR THE PREPARATION OF ELECTROCONDUCTIVE TRANSPARENT LAYERS

The present invention relates to a composition suitable for the preparation of an electroconductive transparent layer, a method for preparing an electroconductive transparent layer and to the use of said composition for the preparation of said electroconductive layer, respectively.

The term "electroconductive transparent layer" as used herein refers to a layer which (i) is capable of allowing the flow of an electric current when an appropriate voltage is applied and (ii) has a light transmission of 80% or more in the visible region (400-700 nm) measured according to ASTM D1003, see e.g. U.S. Pat. No. 8,049,333. Usually, said layer is arranged on the surface of a substrate, wherein said substrate is typically an electrical isolator. Such electroconductive transparent layers are widely used in flat liquid crystal displays, touch panels, electroluminescent devices, thin film photovoltaic cells, as anti-static layers and as electromagnetic wave shielding layers.

Typically, such electroconductive transparent layer is a composite comprising (i) an optically transparent contiguous solid phase (also referred to as a matrix) and (ii) a conductive network of electroconductive nanoobjects which extends throughout said matrix. The matrix is formed of one or more optically transparent polymers. Said matrix binds the electroconductive nanoobjects within the layer, fills the voids between said electroconductive nanoobjects, provides mechanical integrity and stability to the layer and binds the layer to the surface of the substrate. The conductive network of electroconductive nanoobjects allows for the flow of an electric current between adjacent and overlapping electroconductive nanoobjects within the layer. Due to the small dimensions of the nanoobjects, their influence on the optical behavior of the composite is quite small, thus allowing for the formation of an optically transparent composite, i.e. a composite having a light transmission of 80% or more in the visible region (400-700 nm) measured according to ASTM D1003, see e.g. U.S. Pat. No. 8,049,333.

Typically, such electroconductive transparent layers are prepared by applying to a surface of a substrate a composition comprising sufficient amounts of
  (i) one or more matrix-forming binding agents,
  (ii) electroconductive nanoobjects and
  (iii) optionally auxiliary constituents
dissolved or dispersed in a suitable liquid, and removing those constituents which at 25° C. and 101.325 kPa are liquid (hereinbelow referred to as the liquid constituents) from said composition applied to said surface of said substrate to such extent that on said surface of said substrate an electroconductive transparent layer is formed which comprises constituents of the applied composition which at 25° C. and 101.325 kPa are solid (hereinbelow referred to as solid constituents). Such a composition for the preparation of an electroconductive transparent layer is commonly referred to as an ink.

US 2008/0182090 A1 discloses a composition which is suitable for use as an ink for high speed printing for producing electronic circuitry such as RFID antennas etc., said composition comprising the following constituents
  (a) conductive particles, preferably silver particles, more preferably silver flakes
  (b) styrene/(meth)acrylic copolymer
  (c) an anionic wetting agent
  (d) defoamer and
  (e) water
and optionally at least one solvent selected from the group consisting of alcohols, amines, glycols, acetates, ethers, ketones, aldehydes, and amides. According to US 2008/0182090 A1, the anionic wetting agent is preferably selected from the group consisting of alkali sulfosuccinate and anionic polyacrylate copolymer.

According to US 2008/0182090 A1, the obtained electroconductive layers have a thickness in the range of from 3 µm to 7 µm. Preferably, in said ink according to US 2008/0182090 A1, the concentration of silver particles (a) is about 10 to 90% of the composition, and the concentration the copolymer (b) is about 2 to 50% of the composition. Accordingly, the concentration of constituents which at 25° C. and 101.325 kPa are solid (hereinbelow referred to as solid constituents) is remarkably high in said ink. US 2008/0182090 A1 is silent regarding the optical properties of the obtained electroconductive layers, however it is assumed that the light transmission is rather low and the haze is rather high because of the large amount of solid constituents in the ink. At a given wet thickness of the ink applied to the surface of a substrate for the preparation of an electroconductive layer, the thickness and accordingly the opacity of the obtainable electroconductive layer increases with increasing concentration of solid constituents in the applied ink. Decreasing the thickness and opacity of the obtainable electroconductive layer by decreasing the wet thickness is hardly possible, because for technical reasons there is a lower limit of the wet thickness, and in order to obtain an electroconductive transparent layer at all, the wet thickness must be as close to said lower limit as possible.

US 2012/0097059 A1 discloses an ink composition comprising: a plurality of metal nanostructures, one or more viscosity modifiers and an aqueous liquid carrier including water and one or more water-miscible co-solvents, wherein the water is about 40-60% by weight of the aqueous liquid carrier, wherein the co-solvent is methanol, ethanol, n-propanol, i-propanol, n-butanol, i-butanol, t-butanol, propylene glycol, propylene glycol methyl ether, or ethylene glycol. According to US 2012/0097059 A1 the co-solvent is applied in order to facilitate drying the ink following printing, because for a system of miscible solvents the boiling point is lower than that of each of the pure solvents. According to US 2012/0097059 A1 it is preferable that the ink composition includes one or more surfactants, which serve to adjust the surface tension and wetting. Preferred surfactants are fluorosurfactants, non-ionic surfactants based on alkylphenol ethoxylates, secondary alcohol ethoxylates and acetylenic-based surfactants. In certain embodiments, the ink composition of US 2012/0097059 A1 further comprises an adhesion promoter, wherein the adhesion promoter is an organosilane compound.

In a not pre-published application (application No. 62/037,630) a composition suitable for the preparation of an electroconductive transparent layer is described, said composition comprising electroconductive nanoobjects and one or more dissolved styrene/(meth)acrylic copolymers. It is not disclosed that said composition comprises one or more alcohols selected from the group consisting of methanol, ethanol, n-propanol, i-propanol, n-butanol, i-butanol and t-butanol.

US 2008/0182090 A1 and US 2012/0097059 A1 rely on the addition of wetting agents resp. surfactants to the ink, resulting in increased complexity of ink formulation. Moreover, said wetting agents resp. surfactants usually are substances which are either solid at 25° C. and 101.325 kPa or have such a high boiling point at 101.325 kPa that they are not readily removed after the ink is applied to the substrate. Thus, the wetting agents resp. surfactants remain as foreign matter in the layer which is formed on said surface of said substrate, thereby introducing compositional heterogeneity in said layer and affecting the characteristics of said layer. More specifically, such wetting agents resp. surfactants do not contribute to the electronic conductivity of the layer, and typically do not contribute to matrix formation, but often may have a detrimental effect on the optical properties of the layer, even if said wetting agents resp. surfactants are present in the ink in a quite low concentration. In addition, the presence of a surfactant in the ink may induce foam formation which may result in inhomogeneity and discontinuity of a layer prepared using said ink.

It is an object of the present invention to provide an ink suitable for the preparation of an electroconductive transparent layer having a light transmission of 80% or more measured according to ASTM D1003 (Procedure A) as published in November 2013, wherein said ink reliably and safely wets the substrate to be coated. More specifically it is an object of the present invention to provide an ink which exhibits good wetting properties for substrates made of polyethylene terephthalate (PET). Further specifically it is an object of the invention to reduce complexity of ink formulation and to avoid ink constituents which do not contribute to or even detrimentally influence the characteristics of the electroconductive transparent layers obtainable from said ink.

Further preferably, an electroconductive transparent layer obtainable from said ink shall exhibit a sheet resistance of 1000 Ohm/square or less as measured by the four point probe. Further preferably, said electroconductive transparent layer shall exhibit a haze of 2% or less as measured according to ASTM D1003 (Procedure A) as published in November 2013, and a sheet resistance of 1000 Ohm/square or less as measured by the four point probe.

These and other objects are achieved by a composition according to the present invention, said composition comprising the constituents (A) a mixture comprising
(A-1) water,
(A-2) one or more alcohols selected from the group consisting of methanol, ethanol, n-propanol, i-propanol, n-butanol, i-butanol and t-butanol,
(B) electroconductive nanoobjects,
said electroconductive nanoobjects (B) having two external dimensions in the range of from 1 nm to 100 nm and their third external dimension in the range of from 1 μm to 100 μm
wherein the total weight fraction of said electroconductive nanoobjects (B) is in the range of from 0.01 wt.-% to 1 wt.-% based on the total weight of the composition,
(C) dissolved in mixture (A), one or more styrene/(meth) acrylic copolymers,
said dissolved copolymers (C) each having a number average molecular weight in the range of from 500 g/mol to 22000 g/mol
wherein the total weight fraction of said dissolved copolymers (C) is in the range of from 0.02 wt.-% to 5 wt.-%, based on the total weight of the composition.

Hereinbelow, a composition according to the invention (as defined above) is also referred to as an ink.

In the composition according to the invention (as defined above), the main constituent which at 25° C. and 101.325 kPa is liquid is a mixture (A) comprising
(A-1) water and
(A-2) one or more alcohols selected from the group consisting of methanol, ethanol, n-propanol, i-propanol, n-butanol, i-butanol and t-butanol;
and the main constituents which at 25° C. and 101.325 kPa are solid are the above-defined electroconductive nanoobjects (B) and the above-defined one or more copolymers (C). In the composition according to the present invention (as defined above), the total concentration of constituents which at 25° C. and 101.325 kPa are solid (solid constituents) is 10 wt.-% or less, preferably 8 wt.-% or less, further preferably 5 wt.-% or less, in each case based on the total weight of said composition.

Surprisingly, it has been found that a composition as defined above which comprises a significantly lower amount of solid constituents than the above-mentioned composition (ink) according to US 2008/0182090 A1 is suitable for the preparation of electroconductive transparent layers having superior optical properties as well as satisfying electronic conductivity. In the prior art, inks comprising a rather large concentration of electroconductive nanoobjects have been preferred in order to ensure a high electronic conductivity. Furthermore, US 2008/0182090 A1 focuses on reducing the thermal energy required for drying of the ink, and therefore is limited to inks having a rather high concentration of solid constituents. However, surprisingly it has been found that electroconductive transparent layers having superior optical properties as well as satisfying electronic conductivity can be prepared without incurring excessive requirements of thermal energy for drying when the composition according to the present invention (as defined above) is used.

Constituent (A) of the composition according to the present invention (as defined above) is a mixture comprising
(A-1) water,
(A-2) one or more alcohols selected from the group consisting of methanol, ethanol, n-propanol, i-propanol, n-butanol, i-butanol and t-butanol.

Said mixture (A) is monophase (i.e. forms a single phase).

Surprisingly it has been found that the presence of one or more alcohols (A-2) as defined above does not only promote wetting of the surface of a substrate to which the composition according to the present invention (as defined above) is applied but also promotes the dispersibility of the nanoobjects (B) (especially in the case of nanoobjects (B) in the form of silver nanowires) in the ink, resulting in improved connectivity of the conductive network formed in the electroconductive layer obtainable from said composition.

Preferably the mixture (A) consists of
(A-1) water and
(A-2) one or more alcohols selected from the group consisting of methanol, ethanol, n-propanol, i-propanol, n-butanol, i-butanol and t-butanol.

More preferably the mixture (A) consists of
(A-1) from 70% to <100% of water,
(A-2) from >0 to 30% of one or more alcohols selected from the group consisting of methanol, ethanol, n-propanol, i-propanol, n-butanol, i-butanol and t-butanol,
in each case based on the total volume of the mixture (A).

Further preferably the mixture (A) consists of
(A-1) 70% to 98% of water,
(A-2) 2% to 30% of one or more alcohols selected from the group consisting of methanol, ethanol, n-propanol, i-propanol, n-butanol, i-butanol and t-butanol,
in each case based on the total volume of the mixture (A).

If the proportion of (A-2) the alcohols selected from the group consisting of methanol, ethanol, n-propanol, i-propanol, n-butanol, i-butanol and t-butanol in the mixture (A) is more than 30% based on the total volume of the mixture (A), in some cases the solubility of the styrene/(meth)acrylic copolymers decreases and flocculation of said copolymers (C) may occur. Furthermore, if the proportion of said alcohols (A-2) is more than 30% based on the total volume of the mixture (A), the drying speed of the ink is fast, which may result in clogging of fluid passages in the coating equipment which the ink must pass in the process of coating.

If the proportion of (A-2) the alcohols selected from the group consisting of methanol, ethanol, n-propanol, i-propanol, n-butanol, i-butanol and t-butanol in the mixture (A) is less than 2 wt.-% based on the total volume of the mixture (A), than the effect of the presence of one or more of said alcohols may be not sufficient.

Particularly preferably the mixture (A) consists of
(A-1) 75% to 85% of water,
(A-2) 15% to 25% of one or more alcohols selected from the group consisting of methanol, ethanol, n-propanol, i-propanol, n-butanol, i-butanol and t-butanol,
in each case based on the total volume of the mixture (A).

Preferably the one or more alcohols (A-2) are selected from the group consisting of i-propanol, n-butanol and t-butanol. These preferred alcohols exhibit the strongest effect in foam reduction during the coating process, relative to their volume fraction in the ink.

Among the alcohols (A-2) as defined above, i-butanol is less preferred due to its low solubility in water. Furthermore, in some cases methanol and ethanol are not preferred because of restrictive legal regulations.

Constituent (B) of the composition according to the present invention (as defined above) consists of electroconductive nanoobjects, said electroconductive nanoobjects (B) having two external dimensions in the range of from 1 nm to 100 nm and their third external dimension in the range of from 1 μm to 100 μm.

According to ISO/TS 27687:2008 (as published in 2008), the term "nanoobject" refers to an object having one, two or three external dimensions in the nanoscale, i.e. in the size range from approximately 1 nm to 100 nm. The electroconductive nanoobjects to be used for the present invention are electroconductive nanoobjects having two external dimensions in the range of from 1 nm to 100 nm and their third external dimension in the range of from 1 μm to 100 μm. Typically, said two external dimensions which are in the range of from 1 nm to 100 nm are similar i.e. they differ in size by less than three times. The third dimension of said electroconductive nanoobjects (B) is significantly larger, i.e. it differs from the other two external dimensions by more than three times.

According to ISO/TS 27687:2008, nanoobjects having two similar external dimensions in the nanoscale, while the third external dimension is significantly larger, are generally referred to as nanofibers. Electrically conductive nanofibers are also referred to as nanowires. Hollow nanofibers (irrespective of their electrical conductivity) are also referred to as nanotubes.

Electroconductive nanoobjects (B) as defined above which are to be used for the present invention typically have a cross section close to circular shape. Said cross section extends perpendicularly to said external dimension which is in the range of from 1 μm to 100 μm. Thus, said two external dimensions which are in the nanoscale are defined by the diameter of said circular cross section. Said third external dimension extending perpendicularly to said diameter is referred to as the length.

Preferably, a composition according to the present invention comprises electroconductive nanoobjects (B) having a length in the range of from 1 μm to 100 μm, preferably of from 3 μm to 50 μm, more preferably of from 10 μm to 50 μm, and a diameter in the range of from 1 nm to 100 nm, preferably of from 2 nm to 50 nm, more preferably of from 3 nm to 30 nm.

The term "electroconductive nanoobject" means that the nanoobject comprises or consists of one or more materials capable of allowing the flow of electrons. Accordingly, a plurality of such electroconductive nanoobjects may form a conductive network of adjacent and overlapping nanoobjects extending throughout said matrix capable of carrying an electric current, provided that there is sufficient interconnection (mutual contact) between individual electroconductive nanoobjects so as to enable the transport of electrons along the interconnected electroconductive nanoobjects within the network.

Preferably, said electroconductive nanoobjects (B) comprise or consist of one or more materials selected from the group consisting of silver, copper, gold and carbon.

Preferably, the electroconductive nanoobjects (B) have a length in the range of from 1 μm to 100 μm and a diameter in the range of from 1 nm to 100 nm, wherein said electroconductive nanoobjects (B) comprise one or more materials selected from the group consisting of silver, copper, gold and carbon.

Preferably, said electroconductive nanoobjects (B) are selected from the group consisting of nanowires and nanotubes. Preferred nanowires comprise or consist of one or more metals selected from the group consisting of silver, copper and gold. Preferably, said nanowires each comprise at least 50 wt.-% of one or more metals selected from the group consisting of silver, copper and gold, based on the total weight of said nanowire. Most preferred are nanowires each comprising 50 wt.-% or more of silver based on the total weight of said nanowire (hereinbelow also referred to as "silver nanowires").

Preferred nanotubes are carbon nanotubes.

Among nanowires and nanotubes, nanowires are preferred.

Most preferred electroconductive nanoobjects (B) according to the present invention are silver nanowires having the above-mentioned dimensions.

Suitable electroconductive nanoobjects (B) as defined above are known in the art and are commercially available.

Silver nanowires (as well as nanowires of other metals) are typically commercially available in the form of an aqueous dispersion wherein polyvinylpyrrolidone is adsorbed onto the surface of the silver nanowires in order to render the dispersion stable. Any matter adsorbed on the surface of the nanowires is not included in the above-defined dimensions and composition of the electroconductive nanoobjects (B).

Preferably, the silver nanowires are obtained by the procedure described by Yugang Sun and Younan Xia in Adv. Mater 2002 14 No. 11, June 5, pages 833-837.

In preferred embodiments the composition according to the present invention does not comprise carbon nanotubes.

Preferably, in the composition according to the invention (as defined above) the total weight fraction of said electroconductive nanoobjects (B) as defined above is 0.8 wt.-% or less, preferably 0.5 wt.-% or less, based on the total weight of the composition. The total weight fraction of said electroconductive nanoobjects (B) is not less than 0.01 wt.-%, based on the total weight of the composition, because a total weight fraction of less than 0.01 wt.-% of electroconductive nanoobjects (B) may be not sufficient for forming a conductive network, so that such composition is not suitable for preparing an electroconductive layer. Further preferably the total weight fraction of said electroconductive nanoobjects (B) is not less than 0.02 wt.-%, preferably not less than 0.05 wt.-%.

Constituent (C) of the composition according to the present invention (as defined above) consists of one or more styrene/(meth)acrylic copolymers dissolved in mixture (A) wherein said dissolved copolymers (C) each have a number average molecular weight in the range of from 500 g/mol to 22000 g/mol Herein, the term "(meth)acrylic" includes "methacrylic" and "acrylic". In said copolymers (C), each molecule comprises or consists of units derived from monoalkenyl aromatic monomers and units derived from (meth) acrylic monomers in copolymerized form. Such copolymers (C) are obtainable by copolymerisation of one or more kinds of monoalkenyl aromatic monomers with one or more kinds of (meth)acrylic monomers.

In preferred copolymers (C), each molecule comprises or consists of
    units C1 derived from monoalkenyl aromatic monomers MC1
    and
    units C2 derived from (meth)acrylic monomers MC2
    in copolymerized form, wherein
    said units C1 (units derived from monoalkenyl aromatic monomers) have the chemical structure

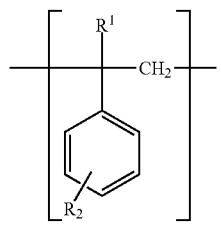
(C1)

wherein $R_1$, independently from the $R_1$ of each other unit C1, is selected from the group consisting of hydrogen and alkyl (including unbranched alkyl, preferably methyl, and branched alkyl, preferably tert-butyl)

and wherein $R_2$, independently from the $R_2$ of each other unit C1, is selected from the group consisting of halogen (preferably chlorine) and alkyl (preferably methyl), and $R_2$ is situated in a position selected from the group consisting of ortho, meta and para;

and said units C2 (units derived from (meth)acrylic monomers) have the chemical structure

(C2)

wherein $R_3$, independently from the $R_3$ of each other unit C2, is selected from the group consisting of hydrogen, methyl, halogen (preferably chlorine) and cyano, and wherein $R_4$, independently from the $R_4$ of each other unit C2, is selected from the group consisting of —COOH,
—COOX wherein X is a cation selected from alkali metal cations, ammonium cations and substituted ammonium cations,
—CN,
—COOR$_5$ wherein $R_5$ is selected from the group consisting of branched and unbranched alkyl groups, branched and unbranched alkenyl groups, branched and unbranched alkinyl groups, cycloalkyl groups, aralkyl groups, aralkenyl groups, furfuryl, tetrahydrofurfuryl, isopropylidene glyceryl, glycidyl and tetrahydropyranyl, wherein said branched and unbranched alkyl groups, alkenyl groups and alkinyl groups include branched and unbranched alkyl groups, alkenyl groups and alkinyl groups substituted with one or more groups selected from the group consisting of hydroxy, alkoxy, phenoxy, halogen, sulfo, nitro, oxazolidinyl, monoalkylamino and dialkylamino groups
—CHO,
—NR$_6$R$_7$ wherein $R_6$ and $R_7$ are independently selected from the group consisting of hydrogen, alkyl and phenyl.

Such copolymers (C) are obtainable by copolymerisation of one or more kinds of monoalkenyl aromatic monomers MC1 having the formula

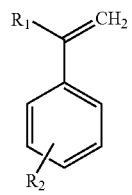
(MC1)

wherein $R_1$, independently from the $R_1$ of each other monomer MC1, is selected from the group consisting of hydrogen and alkyl (including unbranched alkyl, preferably methyl, and branched alkyl, preferably tert-butyl)

and wherein $R_2$, independently from the $R_2$ of each other monomer MC1, is selected from the group consisting of halogen (preferably chlorine) and alkyl (preferably methyl) and $R_2$ is situated in a position selected from the group consisting of ortho, meta and para, with one or more kinds of (meth)acrylic monomers MC2 having the formula

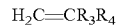
$$H_2C=CR_3R_4 \quad (MC2)$$

wherein $R_3$, independently from the $R_3$ of each other monomer MC2, is selected from the group consisting of hydrogen, methyl, halogen (preferably chlorine) and cyano, and wherein $R_4$, independently from the $R_4$ of each other unit C1 is selected from the group consisting of
—COOH,
—COOX wherein X is a cation selected from alkali metal cations, ammonium cations and substituted ammonium cations,
—CN,
—COOR$_5$ wherein $R_5$ is selected from the group consisting of branched and unbranched alkyl groups, branched and unbranched alkenyl groups, branched and unbranched alkinyl groups, cycloalkyl groups, aralkyl groups, aralkenyl groups, furfuryl, tetrahydrofurfuryl, isopropylidene glyceryl, glycidyl and tetrahydropyranyl, wherein said branched and unbranched alkyl groups, alkenyl groups and alkinyl groups include branched and unbranched alkyl groups, alkenyl groups and alkinyl groups substituted with one or more groups selected from the group consisting of hydroxy, alkoxy, phenoxy, halogen, sulfo, nitro, oxazolidinyl, monoalkylamino and dialkylamino groups

—CHO,

—$NR_6R_7$ wherein $R_6$ and $R_7$ are independently selected from the group consisting of hydrogen, alkyl and phenyl.

The term "(meth)acrylic monomer" MC2 as employed herein includes acrylic acid and salts, esters and amides of acrylic acid, acrylonitrile and acrolein, as well as methacrylic acid and salts, esters and amides of methacrylic acid, methacrylonitrile, and methacrolein.

(Meth)acrylic monomers, wherein $R_3$ is hydrogen or methyl, resp., and $R_4$ is —COOH, are acrylic acid or methacrylic acid, resp.

(Meth)acrylic monomers wherein $R_3$ is hydrogen or methyl, resp., and $R_4$ is —$COOR_5$ as defined above, are esters of acrylic acid or esters of methacrylic acid, resp.

(Meth)acrylic monomers wherein $R_3$ is hydrogen or methyl, resp., and $R_4$ is —COOX as defined above, are salts of acrylic acid or salts of methacrylic acid, resp.

(Meth)acrylic monomers wherein $R_3$ is hydrogen or methyl, resp., and $R_4$ is —CN, are acrylonitrile or methacrylonitrile, resp.

Copolymers (C) obtainable by copolymerization of one or more kinds of monoalkenyl aromatic monomers MC1 and one or more (meth)acrylic monomers from the group consisting of acrylonitrile and methacrylonitrile and no other (meth)acrylic monomers MC2 are not preferred. In this regard it is preferred that for the preparation of copolymer (C) (meth)acrylic monomers selected from the group consisting of acrylonitrile and methacrylonitrile are used in combination with other (meth)acrylic monomers MC2 as defined herein.

(Meth)acrylic monomers wherein $R_3$ is hydrogen or methyl, resp., and $R_4$ is —$NR_6R_7$ as defined above, are amides of acrylic acid or amides of methacrylic acid, resp.

(Meth)acrylic monomers wherein $R_3$ is hydrogen or methyl, resp., and $R_4$ is —CHO are acrolein or methacrolein, resp.

Preferable monoalkenyl aromatic monomers MC1 are selected from the group consisting of alpha-methyl styrene, styrene, vinyl toluene, tertiary butyl styrene and orthochlorostyrene.

Examples of suitable (meth)acrylic monomers include the following methacrylate esters (methacrylic acid esters): methyl methacrylate, ethyl methacrylate, n-propyl methacrylate, n-butyl methacrylate, isopropyl methacrylate, isobutyl methacrylate, n-amyl methacrylate, n-hexyl methacrylate, isoamyl methacrylate, 2-hydroxyethyl methacrylate, 2-hydroxypropyl methacrylate, N,N-dimethylaminoethyl methacrylate, N,N-diethylaminoethyl methacrylate, t-butylaminoethyl methacrylate, 2-sulfoethyl methacrylate, trifluoroethyl methacrylate, glycidyl methacrylate, benzyl methacrylate, allyl methacrylate, 2-n-butoxyethylmethacrylate, 2-chloroethyl methacrylate, secbutyl-methacrylate, tert-butyl methacrylate, 2-ethylbutyl methacrylate, cinnamyl methacrylate, crotyl methacrylate, cyclohexyl methacrylate, cyclopentyl methacrylate, 2-ethoxyethyl methacrylate, furfuryl methacrylate, hexafluoroisopropyl methacrylate, methallyl methacrylate, 3-methoxybutyl methacrylate, 2-methoxybutyl methacrylate, 2-nitro-2-methylpropyl methacrylate, n-octylmethacrylate, 2-ethylhexyl methacrylate, 2-phenoxyethyl methacrylate, 2-phenylethyl methacrylate, phenyl methacrylate, prop-2-inyl methacrylate, tetrahydrofurfurylmethacrylate and tetrahydropyranylmethacrylate. Typical acrylate esters employed include: methyl acrylate, ethyl acrylate, n-propyl acrylate, isopropyl acrylate, n-butyl acrylate and n-decyl acrylate, methyl alpha-chloroacrylate, methyl 2-cyanoacrylate. Other suitable (meth)acrylic monomers include methacrylonitrile, methacrylamide, N-methylmethacrylamide, N-ethylmethacrylamide, N, N-diethylmethacrylamide, N,N-dimethylmethacrylamide, N-phenylmethacrylamide and methacrolein, acrylonitrile, acrylamide, N-ethylacrylamide, N,N-diethylacrylamide and acrolein.

Esters of methacrylic acid or acrylic acid containing a suitable condensable cross linkable functional group may be used as the monomer. Among such esters are t-butylaminoethyl methacrylate, isopropylidene glyceryl methacrylate and oxazolidinylethyl methacrylate.

Typical preferred cross-linkable acrylates and methacrylates include hydroxy alkyl acrylates, hydroxyl alkyl methacrylates and hydroxyesters of glycidyl acrylates or methacrylates. Examples of preferred hydroxy functional monomers include 2-hydroxyethyl acrylate, 3-chloro-2-hydroxypropyl acrylate, 2-hydroxy-butyl acrylate, 6-hydroxyhexyl acrylate, 2-hydroxymethyl methacrylate, 2-hydroxypropyl methacrylate, 6-hydroxyhexyl methacrylate, 5,6-dihydroxyhexyl methacrylate and the like.

The term "styrene/(meth)acrylic copolymer" as employed herein includes copolymers obtainable from mixtures consisting of two or more (meth)acrylic monomers and one or more monoalkenyl aromatic monomers, as well as copolymers obtainable from mixtures of at least one (meth)acrylic monomer and at least one non-acrylic ethylenic monomer and one or more monoalkenyl aromatic monomers. Suitable ethylenic monomers include: vinyl pyridine, vinyl pyrrolidone, sodium crotonate, methyl crotonate, crotonic acid and maleic anhydride.

For further details regarding the above-defined copolymers (C), reference is made to US 2008/0182090, U.S. Pat. Nos. 4,414,370, 4,529,787, 4,546,160, 5,508,366 and the prior art cited therein.

The number average molecular weight of each of said copolymers (C) is in the range of from 500 g/mol to 22000 g/mol, preferably of from 1700 g/mol to 15500 g/mol, further preferably of from 5000 g/mol to 10000 g/mol.

Typically, the water-soluble copolymers (C) are amphiphilic, because their molecules contain non-polar hydrophobic regions derived from the monoalkenyl aromatic monomers and polar hydrophilic regions derived from the (meth)acrylic monomers. Thus, the desired amphiphilic behavior is obtainable by appropriate selection of the hydrophobic monoalkenyl aromatic monomers and the hydrophilic (meth)acrylic monomers and appropriate adjustment of the ratio between monoalkenyl aromatic monomers and (meth)acrylic monomers so that a copolymer (C) is obtained which has an appropriate ratio between hydrophobic units derived from monoalkenyl aromatic monomers and hydrophilic units derived from (meth)acrylic monomers to allow for amphiphilic behavior of the copolymer. In aqueous solution said water-soluble copolymers (C) behave like surfactants (tensides), i.e. they are capable of forming micelles. A micelle is an aggregate formed by association of dissolved amphiphilic molecules. Preferably said micelles have a diameter of up to 5 nm.

Typical water-soluble copolymers (C) are known in the art and commercially available. Typically such copolymers are commercially available in the form of aqueous solutions.

Preferably, in the composition according to the invention (as defined above), the total weight fraction of said dissolved copolymers (C) is less than 2 wt.-%, more preferably 1.8 wt.-% or less, further preferably 1.5 wt.-% or less, especially preferably 1 wt.-% or less, based on the total weight of the composition. The total weight fraction of said dissolved to copolymers (C) is not less than 0.02 wt.-%, based on the total weight of the composition, because a total weight fraction of less than 0.02 wt.-% of said dissolved copolymers (C) may be not sufficient for binding the electroconductive nanoobjects (B) so that such composition is not suitable for preparing an electroconductive layer. Further preferably the total weight fraction of said dissolved copolymers (C) is not less than 0.05 wt.-%, preferably not less than 0.1 wt.-%.

The mixture (A) as defined above and the one or more copolymers (C) as defined above dissolved therein are monophase (i.e. form a single phase).

Preferably the composition according to the invention as defined above does not contain any copolymer (C) (as defined above) in non-dissolved form.

Preferably, in the composition according to the present invention (as defined above), the ratio between the total weight of said electroconductive nanoobjects (B) and the total weight of said dissolved copolymers (C) is in the range of from 1:20 to 20:1, preferably from 1:10 to 5:1, further preferably from 1:5 to 5:1.

The composition according to the present invention optionally comprises further constituents beside the above-defined constituents (A) to (C), e.g. defoaming agents, rheological controlling agents, corrosion inhibitors and other auxiliary agents. Typical defoaming agents, rheological controlling agents and corrosion inhibitors are known in the art and commercially available. However, surprisingly it has been found that compositions according to the invention (as defined above) which do not contain any further constituents beyond the above-defined constituents (A-1), (A-2), (B) and (C) and optionally polyvinylpyrrolidone, wherein typically at least a portion of said polyvinylpyrrolidone is adsorbed onto the surface of the silver nanowires (see above) are suitable for the preparation of electroconductive transparent layers having superior optical properties as well as satisfying electronic conductivity. Accordingly, the addition of any auxiliary agents can be omitted, thus rendering the composition less complex and facilitating preparation of such composition. Accordingly, in preferred embodiments a composition according to the present invention consists of above-defined constituents (A-1), (A-2), (B) and (C) and optionally polyvinylpyrrolidone, wherein typically at least a portion of said polyvinylpyrrolidone is adsorbed onto the surface of the silver nanowires. Nevertheless, in certain embodiments the composition according to the present invention (as defined above) comprises one or more auxiliary agents, especially those as defined above.

Particularly preferably the composition according to the present invention does not contain any surfactants except the styrene/(meth)acrylic copolymers (C) as defined above and alcohols (A-2) as defined above and optionally polyvinylpyrrolidone, wherein typically at least a portion of said polyvinylpyrrolidone is adsorbed onto the surface of the silver nanowires.

Particularly preferably the composition according to the present invention does not contain any organosilanes.

Especially preferably the composition according to the present invention does not contain any surfactants except the styrene/(meth)acrylic copolymers (C) as defined above and alcohols (A-2) as defined above and does not contain any organosilanes.

It is understood that any further constituents (beside the above-defined constituents (A) to (C)) of the composition according to the present invention (as defined above) as well as the amounts of such further constituents have to be selected in such manner that the electrical conductivity and the optical properties of a layer obtainable from said composition are not compromised.

Preferred compositions according to the present invention are those wherein two or more of the above-defined preferred features are combined.

Particularly preferred is a composition according to the present invention, said composition comprising or consisting of
  (A) a mixture consisting of
  (A-1) 70% to 98% of water,
  (A-2) 2% to 30% of one or more alcohols selected from the group consisting of methanol, ethanol, n-propanol, i-propanol, n-butanol, i-butanol and t-butanol
  in each case based on the total volume of the mixture (A);
  (B) silver nanowires
    said silver nanowires (B) having a length in the range of from 10 μm to 50 μm and a diameter in the range of from 3 nm to 30 nm
    wherein the total weight fraction of said silver nanowires (B) is 0.5 wt.-% or less, based on the total weight of the composition;
  (C) dissolved in mixture (A), a styrene/(meth)acrylic copolymer,
    said dissolved copolymer (C) having a number average molecular weight in the range of from 1700 g/mol to 15500 g/mol
    wherein the weight fraction of said dissolved copolymer (C) is less than 2 wt.-%, preferably 1.5 wt.-% or less, based on the total weight of the composition
  wherein the ratio between
  the total weight of said silver nanowires (B)
  and
  the weight of said dissolved copolymer (C)
  is in the range of from 1:5 to 5:1.

A composition according to the present invention is preparable e.g. by suspending an appropriate amount of the above-defined electroconductive nanoobjects (B) in water (A-1) and dissolving an appropriate amount of the above-defined one or more copolymers (C) in water (A-1) and adding an appropriate amount of one or more alcohols (A-2) as defined above, or by combining appropriate amounts of a pre-manufactured aqueous suspension of said electroconductive nanoobjects (B) and of a pre-manufactured aqueous solution of said one or more copolymers (C) and adding an appropriate amount of one or more alcohols (A-2) as defined above, or by suspending an appropriate amount of said electroconductive nanoobjects (B) in a pre-manufactured aqueous solution of said one or more copolymers (C) and adding an appropriate amount of one or more alcohols (A-2) as defined above, or by dissolving an appropriate amount of said one or more copolymers (C) in a pre-manufactured aqueous suspension of said electroconductive nanoobjects (B) and adding an appropriate amount of one or more alcohols (A-2) as defined above. In preferred embodiments, after combining the constituents (A-1), (A-2), (B) and (C) as defined above and optionally further constituents (as defined above), the composition is subjected to ball-milling in order to improve homogenization of the composition. In certain embodiments, a prolonged homogenization treatment is preferably in order to ensure that the obtained layers have a low haze.

A further aspect of the present invention relates to a method for preparing on a substrate an electroconductive layer having a light transmission of 80% or more measured according to ASTM D1003 (Procedure A) as published in November 2013. Said method according to the present invention comprises the steps of:

preparing or providing a composition according to the present invention as defined above, applying said composition to a surface of a substrate, removing the constituents which at 25° C. and 101.325 kPa are liquid from said composition applied to said surface of said substrate to such extent that a layer is formed on said surface of said substrate.

The layer prepared by the above-defined method of the invention is a solid electroconductive layer having a light transmission of 80% or more measured according to ASTM D1003 (Procedure A) as published in November 2013, said layer comprising or consisting of the solid constituents of said composition according to the present invention as defined above, wherein said layer optionally comprises said one or more of said copolymers (C) in crosslinked form. More specifically, in embodiments where the composition applied to a surface of a substrate comprises one or more copolymers (C) which are cross-linkable, the formed layer comprises said one or more of said copolymers (C) in crosslinked form.

In the context of the present application, the process step of removing the constituents which at 25° C. and 101.325 kPa are liquid from said composition applied to said surface of said substrate to such extent that a layer is formed on said surface of said substrate is also referred to as drying. Usually, the liquid constituents are removed by evaporation.

Generally, the liquid constituents have to be removed at least to such extent that on said surface of said substrate an electroconductive layer having a light transmission of 80% or more measured according to ASTM D1003 (Procedure A) as published in November 2013 is formed, wherein the one or more copolymers (C) form a contiguous solid phase (also referred to as a matrix) binding the electroconductive nanoobjects (B) which in turn form a conductive network extending throughout said solid matrix. Preferably, said electroconductive layer has a thickness in the range of from 10 nm to 1000 nm, preferably of from 50 nm to 500 nm. Generally the lower limit of the thickness of the electroconductive layer is determined by the smallest dimension of the nanoobjects of the applied composition.

Preferably the constituents which at 25° C. and 101.325 kPa are liquid are completely removed from said composition applied to said surface of said substrate.

Applying said composition according to the invention to said surface of said substrate is preferably carried out by means of a technique selected from the group consisting of spin coating, draw down coating, roll-to-roll coating, gravure printing, microgravure printing, screen-printing, flexo-printing and slot-die coating.

Preferably, said composition is applied to said surface of said substrate in a thickness in a range of from 1 μm to 200 μm, preferably of from 2 μm to 60 μm. Said thickness is also referred to as "wet thickness" and relates to the state before removing the liquid constituents of the composition as explained above. At a given target thickness (after removing the liquid constituents of the composition as explained above) and accordingly a given target sheet resistance and light transmission of the electroconductive layer to be prepared, the wet thickness may be the higher the lower the concentration of solid constituents in the composition is in the ink. The process of applying the ink is facilitated when there is no constraint to apply the ink in particular low wet thickness.

Said substrate to which said composition according to the present invention (as defined above) is applied is typically an electrical isolator. Preferably said substrate comprises or consists of a material selected from the group consisting of glass and organic polymers. Preferred organic polymers are selected from the group consisting of polycarbonate (PC), cyclic olefin copolymer (COP), polyvinylidene fluoride (PVDF), polyimide (PI) and polyethylene terephthalate (PET). Preferably, said substrate comprises polyethylene terephthalate.

Preferably, said substrate has a light transmission of 80% or more measured according to ASTM D1003 (Procedure A) as published in November 2013.

Removing (to such extent as explained above) of those constituents which are liquid at 25° C. and 101.325 kPa from said composition applied to said surface of said substrate is preferably achieved by subjecting said composition applied to said surface of said substrate to a temperature in the range of from 100° C. to 150° C. for a duration of 15 minutes or less. In this regard, the skilled person is aware that said temperature has to be selected under consideration of the thermal stability of the substrate.

Preferred methods according to the present invention are those wherein two or more of the above-defined preferred features are combined.

"Light transmission" refers to the percentage of an incident light which is transmitted through a medium. Preferably the light transmission of an electroconductive layer according to the present invention is 85% or more, more preferably 90% or more, further preferably 95% or more, in each case measured according to ASTM D1003 (Procedure A) as published in November 2013.

A preferred electroconductive layer prepared by the above-defined method of the invention exhibits a haze of 2% or less as measured according to ASTM D1003 (Procedure A) as published in November 2013, and/or a sheet resistance of 1000 Ohm/square or less as measured by the four point probe.

Preferably the haze of the electroconductive layer 1.8% or less, more preferably 1.5% or less, further preferably 1.2% or less, in each case measured according to ASTM D1003 (Procedure A) as published in November 2013.

Preferably the sheet resistance of the electroconductive layer is 800 Ohm/square or less, more preferably 500 Ohm/square or less, further preferably 200 Ohm/square or less, in each case measured by the four point probe.

The measurement of haze and light transmission (in ASTM D1003 as published in November 2013 referred to as luminous transmittance which is the ratio of the luminous flux transmitted by a body to the flux incident upon it) by means of a hazemeter is defined in ASTM-D1003 as published in November 2013 as "Procedure A—Hazemeter". The values of haze and light transmission (corresponding to the luminous transmittance as defined in ASTM D1003 as published in November 2013) given in the context of the present invention refer to this procedure.

Generally, haze is an index of the light diffusion. It refers to the percentage of the quantity of light separated from the incident light and scattered during transmission. Unlike light transmission, which is largely a property of the medium, haze is often a production concern and is typically caused by surface roughness, and by embedded particles or compositional heterogeneities in the medium.

According to ASTM D1003 as published in November 2013, in transmission, haze is the scattering of light by a specimen responsible for the reduction in contrast of objects viewed through said specimen, i.e. the percent of transmitted light that is scattered so that its direction deviates more than a specified angle (2.5°) from the direction of the incident beam.

The sheet resistance is a measure of resistance of a thin body (sheet) namely uniform in thickness. The term "sheet resistance" implies that the current flow is along the plane of the sheet, not perpendicular to it. For a sheet having a thickness t, a length L and a width W, the resistance R is $$R = \rho * \frac{L}{Wt} = \frac{\rho}{t} * \frac{L}{W} = R_{sh} * \frac{L}{W}$$

wherein $R_{sh}$ is the sheet resistance. Accordingly the sheet resistance $R_{sh}$ is $$R_{sh} = R * \frac{W}{L}$$

In the formula given above the bulk resistance R is multiplied with a dimensionless quantity (W/L) to obtain the sheet resistance $R_{sh}$, thus the unit of sheet resistance is Ohms. For the sake of avoiding confusion with the bulk resistance R, the value of the sheet resistance is commonly indicated as "Ohms per Square" because in the specific case of a square sheet W=L and R=$R_{sh}$. The sheet resistance is measured by means of a four point-probe.

Further details of the measurement of the sheet resistance and the haze are given below in the examples section.

More preferably, an electroconductive layer prepared by the above-defined method of the invention exhibits one or more of the following features:
- a haze of 1% or less as measured according to ASTM D1003 (procedure A) as published in November 2013,
- a sheet resistance of 100 Ohm/square or less as measured by the four point probe,
- light transmission of 90% or more as measured according to ASTM D1003 (procedure A) as published in November 2013.

Preferred electroconductive layers are those wherein two or more of the above-defined preferred features are combined.

A particularly preferred electroconductive layer prepared by the above-defined method of the invention exhibits the following features:
- a haze of 1% or less as measured according to ASTM D1003 (Procedure A) as published in November 2013, and
- a sheet resistance of 100 Ohm/square or less as measured by the four point probe, and
- a light transmission of 90% or more as measured according to ASTM D1003 (Procedure A) as published in November 2013.

Without wishing to be bound to any theory, it is presently assumed that in an electroconductive layer prepared by the above-defined method of the invention the network of electroconductive nanoobjects exerts a reinforcing effect on the matrix, thus imparting stability against environmental influences as well as mechanical integrity to said electroconductive layer. In addition, it is assumed that the hydrophobic regions of the one or more copolymers (C) enable strong adhesion to the substrate, especially in the case of a substrate comprising a material selected from the group consisting of organic polymers.

Typical applications of electroconductive layers prepared by the above-defined method of the invention are selected from the group consisting of transparent electrodes, touch panels, wire polarizers, capacitive and resistive touch sensors, EMI shielding, transparent heaters (e.g. for automobile and other applications), flexible displays, plasma displays, electrophoretic displays, liquid crystal displays, transparent antennas, electrochromic devises (e.g. smart windows), photovoltaic devices (especially thin-film photovoltaic cells), electroluminescent devices, light emitting devices (LED) and organic light emitting devices (OLED), flexible devices that can be worn (so-called wearables) such as flexible watches or foldable screens, as well as functional coatings imparting anti-fogging, anti-icing or antistatic properties, and dielectric and ferroelectric haptic films. However the present invention is not limited by these applications and can be used in many other electro optical devices by those skilled in the art.

A further aspect of the present invention relates to the use of a composition according to the present invention (as defined above) for the preparation of an electroconductive layer having a light transmission of 80% or more measured according to ASTM D1003 (procedure A) as published in November 2013 on a substrate. Preferably, said substrate comprises polyethylene terephthalate.

The invention is hereinafter further illustrated by means of examples.

Inks comprising alcohol (A-2) and water (A-1) in a volume ratio of 1/9

An aqueous dispersion of silver nanowires (nanoobjects (B) as defined above) and an aqueous solution of a styrene/acrylic copolymer (C) as defined above (Joncryl 60, commercially available from BASF) is mixed with a selected aliphatic alcohol (A-2) (see table 1 hereinbelow) for a dispersing time of 30 minutes so as to obtain an ink having a concentration of silver nanowires of 3.6 mg/ml and a weight ratio of silver nanowires (B) to copolymer (C) as indicated in table 1. The volume ratio of the selected aliphatic alcohol (A-2) to water (A-1) is set to 1/9.

The ink is applied to a polymer substrate using a drawdown bar (Erichsen K303) (wet thickness t=6 μm, coating speed v=2"/sec) to obtain a layer on said substrate. The layer is then dried at 135° C. for 5 min. In examples 1-7 the substrate is an optical polycarbonate foil (e. g. commercially available under the product specification Makrofol DE 1-1 175 μm from Bayer Material Science). In examples 8-14 the substrate is an optical polyethylene terephthalate foil (e. g. commercially available under the product specification Melinex 506 from Dupont).

The sheet resistance Rsh given in Ohms/square (OPS) of the dried layer is measured by a four-point probe station (Lucas lab pro-4) and the optical properties (as defined above) are measured according to ASTM D1003 procedure A-Hazemeter (as published in November 2013) by a hazegard plus hazemeter (BYK Gardner). The results are compiled in table 1. All obtained layers have satisfying values of sheet resistance, transparency and haze. The most significant suppression of foam formation in the coating process was achieved with alcohols (A-2) selected from the group consisting of i-propanol, n-butanol and t-butanol.

TABLE 1

| Example number | Kind of alcohol (A-2) | Weight ratio silver nanowires (B)/ copolymer (C) | Rsh (OPS) | T (%) | H (%) | H (substrate subtracted) (%) |
|---|---|---|---|---|---|---|
| 1 | methanol | 1:3 | 53 | 90.3 | 1.07 | 0.94 |
| 2 | ethanol | 1:3 | 60 | 89.7 | 0.96 | 0.83 |

TABLE 1-continued

| Example number | Kind of alcohol (A-2) | Weight ratio silver nanowires (B)/ copolymer (C) | Rsh (OPS) | T (%) | H (%) | H (substrate subtracted) (%) |
|---|---|---|---|---|---|---|
| 3 | n-propanol | 1:3 | 58 | 88.5 | 1.20 | 1.07 |
| 4 | i-propanol | 1:3 | 99 | 89.1 | 0.96 | 0.83 |
| 5 | n-butanol | 1:3 | 137 | 88.6 | 1.06 | 0.93 |
| 6 | i-butanol | 1:3 | 119 | 88.7 | 0.99 | 0.86 |
| 7 | t-butanol | 1:3 | 82 | 88.5 | 1.17 | 1.04 |
| 8 | methanol | 1:3 | 84 | 90.3 | 1.49 | 1.06 |
| 9 | ethanol | 1:3 | 65 | 90.3 | 1.51 | 1.08 |
| 10 | n-propanol | 1:3 | 91 | 89.9 | 1.70 | 1.27 |
| 11 | i-propanol | 1:3 | 85 | 90.7 | 1.49 | 1.06 |
| 12 | n-butanol | 1:3 | 157 | 90.3 | 1.59 | 1.16 |
| 13 | i-butanol | 1:3 | 75 | 89.7 | 1.60 | 1.17 |
| 14 | t-butanol | 1:3 | 92 | 89.9 | 1.59 | 1.16 |

Inks comprising alcohol (A-2) and water (A-1) in a volume ratio of 3/7

An aqueous dispersion of silver nanowires (nanoobjects (B) as defined above) and an aqueous solution of a styrene/acrylic copolymer (C) as defined above (Joncryl 60, commercially available from BASF) is mixed with (A-2) isopropanol for a dispersing time of 30 minutes so as to obtain an ink having a concentration of silver nanowires (B) of 5 mg/ml and a weight ratio of silver nanowires (B) to copolymer (C) as indicated in table 2 hereinbelow. The volume ratio of isopropanol (A-2) to water (A-1) is set to 3/7.

The ink is applied to a polymer substrate using a drawdown bar (Erichsen K303) (wet thickness t=6 µm, coating speed v=2"/sec) to obtain a layer on said substrate. The layer is then dried at 135° C. for 5 min. In examples 15-17 the substrate is an optical polycarbonate foil (e. g. commercially available under the product specification Makrofol DE 1-1 175 µm from Bayer Material Science). In examples 18-20 the substrate is an optical polyethylene terephthalate foil (e. g. commercially available under the product specification Melinex 506 from Dupont).

The sheet resistance Rsh given in Ohms/square (OPS) of the dried layer is measured by a four-point probe station (Lucas lab pro-4) and the optical properties (as defined above) are measured according to ASTM D1003 procedure A-Hazemeter (as published in November 2013) by a haze-gard plus hazemeter (BYK Gardner). The results are compiled in table 2. All obtained layers had satisfying values of sheet resistance, transparency and haze. Due to the higher volume fraction of alcohol (A-2) compared to Examples 1-14 (30 vol.-% instead of 10 vol.-%), the foam formation is suppressed further.

TABLE 2

| Example number | Weight ratio silver nanowires (B)/copolymer (C) | Rsh (OPS) | T (%) | H (%) | H (substrate subtracted) (%) |
|---|---|---|---|---|---|
| 15 | 1:1.5 | 50 | 89.1 | 0.91 | 0.78 |
| 16 | 1:3 | 99 | 89.1 | 0.96 | 0.83 |
| 17 | 1:5 | 103 | 89.5 | 0.82 | 0.69 |
| 18 | 1:1.5 | 76 | 90.7 | 1.49 | 1.06 |
| 19 | 1:3 | 85 | 90.7 | 1.47 | 1.04 |
| 20 | 1:5 | 124 | 89.6 | 1.34 | 0.91 |

The invention claimed is:

1. A composition, comprising:
   (A) a mixture comprising, based on a total volume of the mixture:
   (A-1) 70-98 vol % of water, and
   (A-2) 2-30 vol % of one or more alcohols selected from the group consisting of methanol, ethanol, n-propanol, i-propanol, n-butanol, i-butanol and t-butanol,
   (B) electroconductive nanoobjects, said electroconductive nanoobjects (B) having two external dimensions ranging from 1 nm to 100 nm and a third external dimension ranging from 1 µm to 100 µm, wherein a total weight fraction of said electroconductive nanoobjects (B) ranges from 0.01 wt.-% to 1 wt.-% based on a total weight of the composition, and
   (C) dissolved in mixture (A), one or more styrene/(meth)acrylic copolymers, said dissolved copolymers (C) each having a number average molecular weight ranging from 500 g/mol to 22000 g/mol, wherein a total weight fraction of said dissolved copolymers (C) ranges from 0.02 wt.-% to 5 wt.-%, based on the total weight of the composition,
   wherein the composition comprises 5 wt. % or less, based on the total weight of the composition, of constituents which at 25° C. and 101.325 kPa are solid, and
   wherein the composition does not comprise carbon nanotubes.

2. The composition according to claim 1, wherein said electroconductive nanoobjects (B) have
   a length ranging from 1 µm to 100 µm, and
   a diameter ranging from 1 nm to 100 nm,
   wherein said electroconductive nanoobjects (B) comprise one or more materials selected from the group consisting of silver, copper, and gold.

3. The composition according to claim 1, wherein said electroconductive nanoobjects (B) are selected from the group consisting of nanowires and nanotubes.

4. The composition according to claim 1, wherein the ratio between the total weight of said electroconductive nanoobjects (B) and the total weight of said dissolved copolymers (C) ranges from 1:20 to 20:1.

5. The composition according to claim 1, wherein the one or more alcohols (A-2) are selected from the group consisting of i-propanol, n-butanol and t-butanol.

6. The composition according to claim 1, comprising
   (A) the mixture,
   (B) silver nanowires as the electroconductive nanoobjects, said silver nanowires (B) having a length ranging from 10 µm to 50 µm and a diameter ranging from 3 nm to 30 nm, wherein a total weight fraction of said silver nanowires (B) is 0.5 wt.-% or less, based on the total weight of the composition, and
   (C) dissolved in mixture (A), a styrene/(meth)acrylic copolymer,
   said dissolved copolymer (C) having a number average molecular weight ranging from 1700 g/mol to 15500 g/mol, wherein a weight fraction of said dissolved copolymer (C) is less than 2 wt.-%, based on the total weight of the composition,
   wherein a ratio between the total weight of said silver nanowires (B) and the weight of said dissolved copolymer (C) ranges from 1:5 to 5:1.

7. The composition according to claim 1, wherein the mixture consists of:
   (A-1) 75-85 vol % of the water,
   (A-2) 15-25 vol % of the one or more alcohols selected from the group consisting of methanol, ethanol, n-propanol, i-propanol, n-butanol, i-butanol and t-butanol.

8. A method for preparing an electroconductive layer having a light transmission of 80% or more measured according to ASTM D1003 (procedure A) as published in November 2013 on a substrate, the method comprising:
  preparing or providing the composition according to claim 1,
  applying said composition to a surface of a substrate, and
  removing the constituents which at 25° C. and 101.325 kPa are liquid from said composition to such extent that a layer is formed on said surface of said substrate.

9. The method according to claim 8, wherein said applying is carried out by a technique selected from the group consisting of spin coating, draw down coating, roll-to-roll coating, gravure printing, microgravure printing, screen-printing, flexoprinting and slot-die coating.

10. The method according to claim 8, wherein said substrate comprises a material selected from the group consisting of glass and an organic polymer.

11. The method according to claim 8, wherein said substrate comprises polyethylene terephthalate.

12. The method according to claim 9, wherein said removing is achieved by subjecting said composition applied to said surface of said substrate to a temperature ranging from 100° C. to 150° C. for a duration of 15 minutes or less.

* * * * *